(12) United States Patent
Lee

(10) Patent No.: US 7,553,699 B2
(45) Date of Patent: Jun. 30, 2009

(54) METHOD OF FABRICATING MICROELECTRONIC DEVICES

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/515,090

(22) Filed: Aug. 31, 2006

(65) Prior Publication Data
US 2008/0032447 A1    Feb. 7, 2008

(30) Foreign Application Priority Data
Aug. 4, 2006    (SG)    ............... 200605271-6

(51) Int. Cl.
*H01L 21/00* (2006.01)
*H05K 13/00* (2006.01)
*H01L 23/34* (2006.01)

(52) U.S. Cl. .......... 438/110; 438/125; 29/854; 29/857; 29/874; 257/724; 257/774; 257/782; 257/E23.011; 257/E21.577

(58) Field of Classification Search .................. None
See application file for complete search history.

(56) References Cited

U.S. PATENT DOCUMENTS

| 4,783,695 | A | * | 11/1988 | Eichelberger et al. ...... 257/668 |
| 5,510,139 | A | | 4/1996 | Deissner et al. |
| 6,048,755 | A | * | 4/2000 | Jiang et al. ................ 438/118 |
| 6,159,767 | A | * | 12/2000 | Eichelberger ............... 438/107 |
| 6,271,469 | B1 | | 8/2001 | Ma et al. |
| 6,426,241 | B1 | | 7/2002 | Cordes et al. |
| 6,637,103 | B2 | * | 10/2003 | Moden ........................ 29/832 |
| 6,818,544 | B2 | * | 11/2004 | Eichelberger et al. ....... 438/613 |
| 6,917,107 | B2 | * | 7/2005 | Akram ........................ 257/738 |
| 6,982,475 | B1 | * | 1/2006 | MacIntyre .................. 257/620 |
| 7,041,534 | B2 | * | 5/2006 | Chao et al. .................. 438/114 |
| 2005/0287708 | A1 | * | 12/2005 | Kim et al. .................... 438/118 |
| 2006/0046347 | A1 | | 3/2006 | Wood et al. |
| 2006/0125103 | A1 | * | 6/2006 | Japp et al. ................... 257/762 |
| 2006/0157864 | A1 | | 7/2006 | Chen et al. |
| 2007/0182000 | A1 | * | 8/2007 | Higashitani et al. ......... 257/723 |
| 2007/0267136 | A1 | | 11/2007 | Tuominen et al. |

FOREIGN PATENT DOCUMENTS

| FI | 117369 B1 | 9/2006 |
| JP | 11260860 A | 9/1999 |
| TW | 250629 B | 3/2006 |

OTHER PUBLICATIONS

Search Report and Written Opinion issued Dec. 31, 2008 in Singapore Application No. 20060527-6.

\* cited by examiner

*Primary Examiner*—Alonzo Chambliss
(74) *Attorney, Agent, or Firm*—Perkins Coie LLP

(57) ABSTRACT

Microelectronic devices and methods for manufacturing microelectronic devices are disclosed herein. An embodiment of one such method includes forming a plurality of through holes in a substrate with the through holes arranged in arrays, and attaching a plurality of singulated microelectronic dies to the substrate with an active side of the individual dies facing toward the substrate and with a plurality of terminals on the active side of the individual dies aligned with corresponding holes in the substrate. The singulated dies are attached to the substrate after forming the holes in the substrate.

29 Claims, 4 Drawing Sheets

METHOD OF FABRICATING MICROELECTRONIC DEVICES

CROSS-REFERENCE TO RELATED APPLICATION

This application claims foreign priority benefits of Singapore Application No. 200605271-6 filed Aug. 4, 2006, which is incorporated herein by reference in its entirety.

TECHNICAL FIELD

The present invention is related to microelectronic devices and methods for manufacturing microelectronic devices.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies include an array of very small bond-pads electrically coupled to the integrated circuitry. The bond-pads are the external electrical contacts on the die through which the supply voltage, signals, etc., are transmitted to and from the integrated circuitry. After forming the dies, the wafer is thinned by backgrinding, and then the dies are separated from one another (i.e., singulated) by dicing the wafer. Next, the dies are typically "packaged" to connect the bond-pads to a larger array of electrical terminals that can be more easily coupled to the various power supply lines, signal lines, and ground lines.

Conventional die-level packaging processes include (a) attaching individual dies to an interposer substrate, (b) wire-bonding the bond-pads of the dies to the terminals of the interposer substrate, and (c) encapsulating the dies with a molding compound. Die-level packaging, however, has several drawbacks. First, it is time consuming and expensive to mount individual dies to interposer substrates or lead frames. Second, as the demand for higher pin counts and smaller packages increases, it becomes more difficult to form robust wire-bonds that can withstand the forces involved in molding processes. Third, the handling processes for attaching individual dies to interposer substrates or lead frames may damage bare dies.

Another process for packaging microelectronic devices is wafer-level packaging. In wafer-level packaging, a plurality of microelectronic dies are formed on a wafer, and then a redistribution layer is formed over the dies. The redistribution layer has a dielectric layer, a plurality of ball-pad arrays on the dielectric layer, and a plurality of conductive traces in the dielectric layer. Each ball-pad array is arranged over a corresponding die, and the ball-pads in each array are coupled to corresponding bond-pads of the die with the conductive traces. The conductive traces are typically constructed by laser drilling holes in the dielectric layer to expose the bond-pads on the dies, and then depositing conductive material into the holes. After forming the redistribution layer on the wafer, a highly accurate stenciling machine deposits discrete masses of solder paste onto the individual ball-pads. The solder paste is then reflowed to form small solder balls or "solder bumps" on the ball-pads. After forming the solder balls, the wafer is singulated to separate the individual microelectronic devices from one another. The individual microelectronic devices are subsequently attached to a substrate such as a printed circuit board. Microelectronic devices packaged at the wafer-level can have high pin counts in a small area, but they are not as robust as devices packaged at the die-level.

Packaged microelectronic devices can also be constructed by "build-up" packaging. For example, a sacrificial substrate can be attached to a panel that includes a plurality of microelectronic dies and an organic filler that couples the dies together. The sacrificial substrate is generally a ceramic disc that is attached to the active sides of the dies. Next, the back sides of the dies are thinned and a ceramic layer is attached to the back sides. The sacrificial substrate is then removed from the active sides of the dies and build-up layers or a redistribution layer is formed on the active sides of the dies. Packaged devices using a build-up approach on a sacrificial substrate provide high pin counts in a small area and a reasonably robust structure.

The build-up packaging process described above and conventional wafer-level packaging processes, however, have several drawbacks. First, laser drilling holes in the redistribution layer to expose the bond-pads can damage the bond-pads and/or other components on the active side of the dies. Second, because the dielectric layer covers the active side of the dies, it is difficult to properly align the laser beam with the bond-pads. Thus, laser drilling requires an expensive alignment tool to ensure that the holes are aligned with the bond-pads. Third, the bond-pads must be cleaned (e.g., desmeared) to remove residue and other debris after laser drilling the holes. Desmearing processes increase the costs of production and reduce throughput. Accordingly, there is a need to enhance the efficiency and reliability of packaging microelectronic devices.

BRIEF DESCRIPTION OF THE DRAWINGS

FIG. 1A is a schematic side cross-sectional view of a substrate for use in constructing the microelectronic devices.

FIG. 1B is a schematic side cross-sectional view of a microelectronic device assembly including the substrate and a plurality of singulated dies arranged in an array on the substrate.

FIG. 1C is a schematic side cross-sectional view of the microelectronic device assembly after depositing a third conductive layer onto the second conductive layer.

FIG. 1D is a schematic side cross-sectional view of the microelectronic device assembly after depositing a second dielectric layer onto the conductive lines and the first dielectric layer.

FIG. 1E is a schematic side cross-sectional view of the microelectronic device assembly after encasing a portion of the dies.

FIG. 2A is a schematic side cross-sectional view of a substrate and an adhesive layer on the substrate.

FIG. 2B is a schematic side cross-sectional view of a microelectronic device assembly.

FIG. 3A is a schematic side cross-sectional view of a substrate and an adhesive layer on the substrate.

FIG. 3B is a schematic side cross-sectional view of a microelectronic device assembly.

DETAILED DESCRIPTION

A. Overview

Figure 1A:
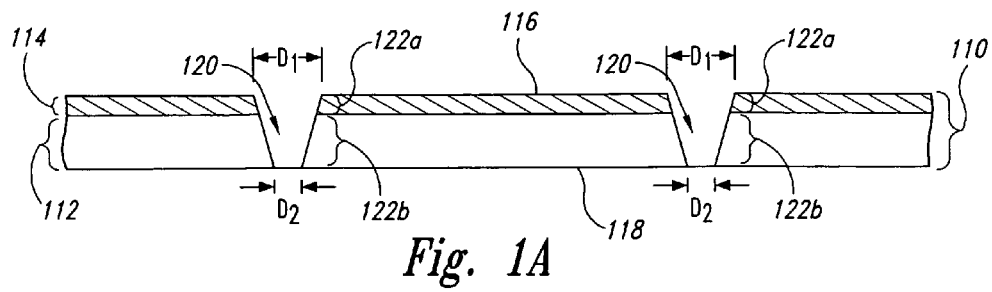
FIGS. 1A-1E illustrate stages in one embodiment of a method for manufacturing a plurality of microelectronic devices.

The following disclosure describes several embodiments of microelectronic devices and methods for manufacturing microelectronic devices. An embodiment of one such method includes (a) providing a substrate having a dielectric layer and a plurality of through holes arranged in arrays, and (b) attaching a plurality of singulated microelectronic dies to the substrate with an active side of the individual dies facing toward the substrate and with a plurality of terminals on the active side of the individual dies aligned with corresponding holes in the substrate. The singulated dies are attached to the substrate after forming the holes in the substrate.

In another embodiment, a method includes providing a plurality of singulated microelectronic dies and a substrate with a plurality of holes arranged in arrays. The individual dies include an active side and a plurality of terminals at the active side. The method further includes (a) coupling the active sides of the singulated dies to the substrate such that the terminals are aligned with corresponding holes, and (b) forming a redistribution structure at the substrate. The redistribution structure includes a plurality of contacts electrically coupled to corresponding terminals on the dies.

In another embodiment, a method includes attaching a plurality of singulated microelectronic dies to a partially cured substrate with an active side of the individual dies facing toward the substrate. The partially cured substrate has a plurality of through apertures, and the individual dies further include a plurality of terminals aligned with corresponding apertures. The method further includes curing the substrate after attaching the singulated dies and constructing a redistribution structure at the substrate. The redistribution structure includes a plurality of conductive lines electrically coupled to corresponding terminals on the dies.

Another aspect of the invention is directed to a microelectronic device assembly. In one embodiment, a microelectronic device assembly includes a substrate having a plurality of holes arranged in arrays and a plurality of singulated microelectronic dies attached to the substrate. The individual dies include an active side facing toward the substrate, a plurality of terminals disposed on the active side and aligned with corresponding holes, a back side opposite the active side, and a plurality of ends extending between the active side and the back side. At least a portion of the individual ends of the dies are exposed.

In another embodiment, a microelectronic device assembly includes a partially cured substrate having a plurality of through holes and a plurality of microelectronic dies attached to the substrate. The individual dies include an active side facing toward the substrate, a plurality of terminals disposed on the active side and aligned with corresponding holes, and an integrated circuit operably coupled to the terminals.

Another aspect of the invention is directed to microelectronic devices. In one embodiment, a microelectronic device includes a preformed substrate having a plurality of through holes arranged in an array and a microelectronic die attached to the substrate. The die includes an active side facing toward the substrate, a plurality of terminals disposed on the active side and aligned with corresponding holes, and an integrated circuit operably coupled to the terminals.

Specific details of several embodiments of the invention are described below with reference to microelectronic devices including microelectronic dies, but in other embodiments the microelectronic devices can include other components. For example, the microelectronic devices can include micromechanical components, data storage elements, optics, read/write components, or other features. The microelectronic dies can be SRAM, DRAM (e.g., DDR-SDRAM), flash-memory (e.g., NAND flash-memory), processors, and other types of devices. Moreover, although the illustrated microelectronic devices are constructed at the wafer level, in additional embodiments the microelectronic devices can be manufactured at the die level. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1A-3B.

B. Embodiments of Methods for Manufacturing Microelectronic Devices

FIGS. 1A-1E illustrate stages in one embodiment of a method for manufacturing a plurality of microelectronic devices. For example, FIG. 1A is a schematic side cross-sectional view of a substrate 110 including a first dielectric layer 112 and a first conductive layer 114 on the dielectric layer 112. The first dielectric layer 112 can include a partially cured material (e.g., B-stage material) for subsequently attaching the substrate 110 to a plurality of dies. For example, the first dielectric layer 112 can be a resin coated copper (RCC) or pre-preg material with woven fiber cloth embedded in a B-stage resin. The first conductive layer 114 can be a foil (e.g., copper foil) formed on the first dielectric layer 112. Suitable substrates 110 include Product No. MCF-6000E manufactured by Hitachi Chemical Co. America, Ltd. of Cupertino, Calif. In other embodiments, such as the embodiments described below with reference to FIGS. 2A-3B, the substrate may not include the first conductive layer, and/or the first dielectric layer 112 may include a fully cured material.

The illustrated substrate 110 further includes a first surface 116 at the first conductive layer 114, a second surface 118 at the first dielectric layer 112, and a plurality of through holes 120 extending between the first and second surfaces 116 and 118. The holes 120 are arranged in arrays with each array corresponding to an arrangement of terminals on a die that is subsequently attached to the substrate 110. The individual holes 120 can have a first dimension $D_1$ at the first surface 116 and a second dimension $D_2$ at the second surface 118. In the illustrated embodiment, the first dimension $D_1$ is greater than the second dimension $D_2$, but in other embodiments the first dimension $D_1$ can be generally equal to or less than the second dimension $D_2$.

The individual holes 120 include a first portion 122a in the first conductive layer 114 and a second portion 122b in the first dielectric layer 112. The first and second portions 122a-b can be formed with different processes. For example, the first portion 122a can be formed by placing a photoresist on the first surface 116 of the substrate 110, patterning and developing the photoresist, and etching the first conductive layer 114 to remove selected portions of the layer 114. The second portion 122b can be formed by laser drilling, punching, etching, or other suitable processes. In additional embodiments, the first and second portions 122a-b of the holes 120 can be formed by the same process.

Figure 1B:
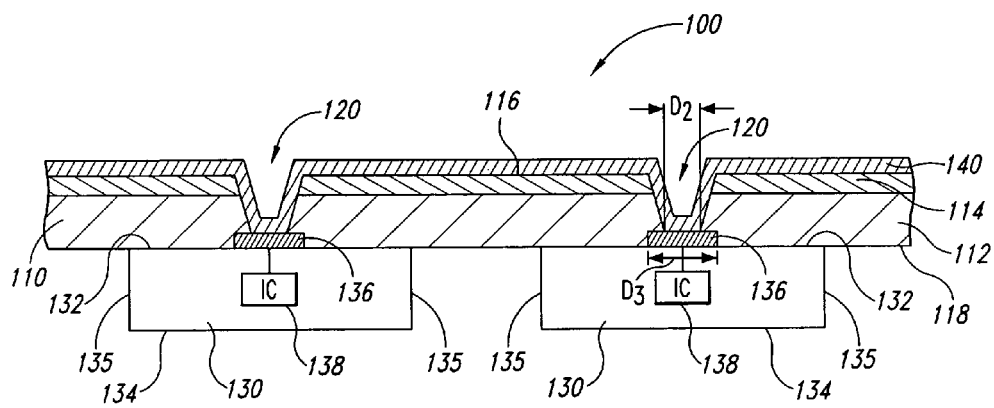

FIG. 1B is a schematic side cross-sectional view of a microelectronic device assembly 100 including the substrate 110 and a plurality of singulated dies 130 arranged in an array on the substrate 110. The individual dies 130 include an active side 132, a back side 134 opposite the active side 132, a plurality of ends 135 extending between the active side 132 and the back side 134, a plurality of terminals 136 (e.g., bond-pads) arranged in an array on the active side 132, and an integrated circuit 138 (shown schematically) operably coupled to the terminals 136. The dies 130 are attached to the substrate 110 with the active sides 132 facing the second surface 118 and with the terminals 136 aligned with corresponding holes 120 such that the terminals 136 and the holes 120 have a one-to-one correspondence. The individual terminals 136 may have a dimension $D_3$ greater than the second dimension $D_2$ (FIG. 1A) of the holes 120 to facilitate proper alignment. In the illustrated embodiment, the dies 130 are attached to the substrate 110 without an adhesive positioned between the second surface 118 and the active sides 132. Rather, the adhesive properties of the partially cured material in the first dielectric layer 112 enable the dies 130 to remain attached to the substrate 110. In other embodiments, such as the embodiments described below with reference to FIGS. 2A-3B, the microelectronic device assembly may include an adhesive for attaching the dies 130 to the substrate 110. Moreover, although the illustrated dies 130 have the same structure, in other embodiments the dies may have different features to perform different functions. In another embodiment, the microelectronic device assembly 100 may include the substrate 110 and a plurality of microelectronic components other than dies. For example, a plurality of capacitors, resistors, inductors, or other devices can be attached to the substrate 110 with the terminals on these devices aligned with corresponding holes 120 in the substrate 110.

After attaching the dies 130 to the substrate 110, the microelectronic device assembly 100 can be heated to fully cure the partially cured material in the dielectric layer 112 and ensure the dies 130 remain connected to the substrate 110. In other embodiments, such as embodiments in which the dielectric layer 112 does not include a partially cured material, the microelectronic device assembly may not be heated after attaching the dies 130 to the substrate 110. In either case, after die attachment, a second conductive layer 140 is deposited onto the substrate 110. Specifically, the second conductive layer 140 is placed in the holes 120 and over the first surface 116 of the substrate 110. The second conductive layer 140 can be formed on the substrate 110 by electroless plating, physical vapor deposition, sputtering, or other suitable processes. In several embodiments, in which the terminals 136 do not have a surface compatible with electroless plating, additional processes such as zincation, sputtering, and/or plating may be necessary to deposit a compatible conductive protective layer (e.g., a nickel layer) on the terminals 136 before depositing the second conductive layer 140. The conductive protective layer prevents the plating solution from damaging the terminals 136.

Figure 1C:
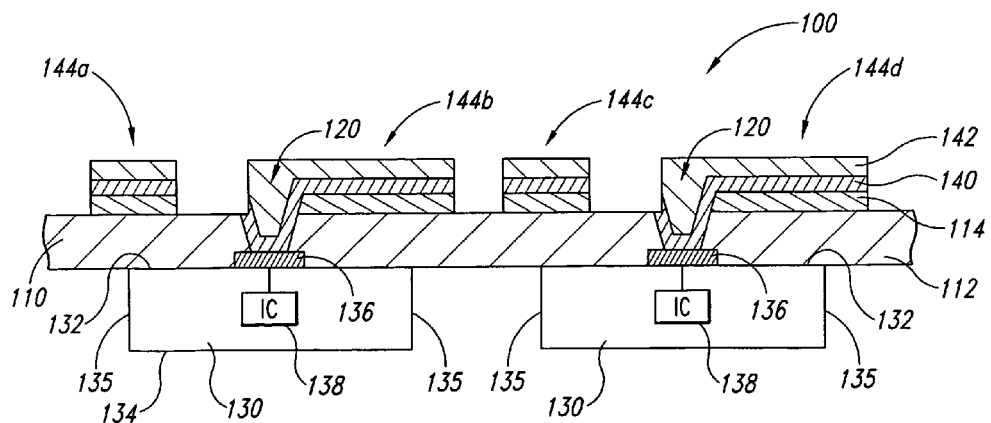

FIG. 1C is a schematic side cross-sectional view of the microelectronic device assembly 100 after depositing a third conductive layer 142 onto the second conductive layer 140. The third conductive layer 142 can be formed by depositing a dry film across the second conductive layer 140, patterning the dry film, and electroplating material onto the exposed sections of the second conductive layer 140. In other embodiments, the third conductive layer 142 can be deposited across the entire second conductive layer 140, or the second and third conductive layers 140 and 142 can be formed as a single layer in one process. In either case, after depositing the third conductive layer 142, sections of the first, second, and/or third conductive layers 114, 140 and/or 142 are removed (e.g., patterned and etched) to form a plurality of conductive lines 144 (identified individually as 144a-d) on the substrate 110. Each conductive line 144 is electrically coupled to a corresponding terminal 136 on a die 130, and the conductive lines 144 are spaced apart from each other.

Figure 1D:
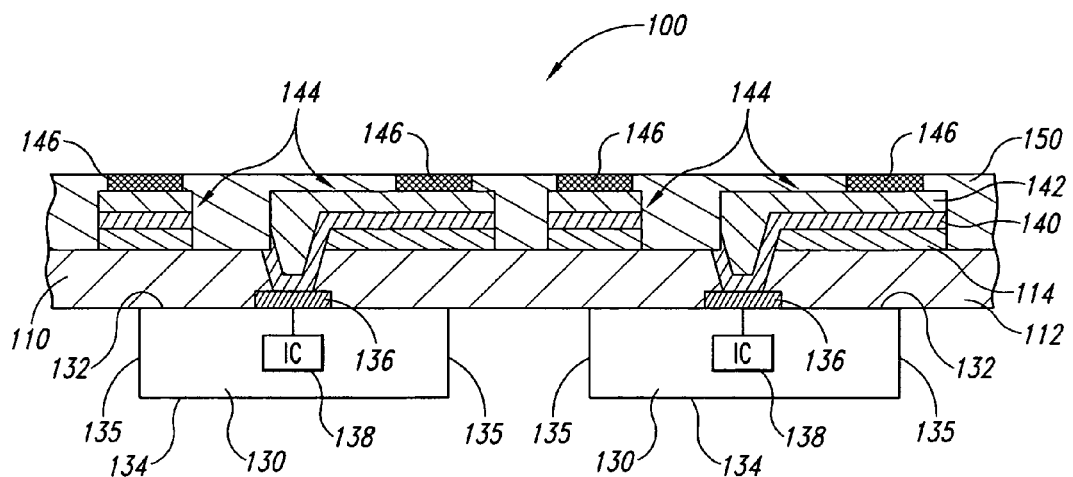

FIG. 1D is a schematic side cross-sectional view of the microelectronic device assembly 100 after depositing a second dielectric layer 150 onto the conductive lines 144 and the first dielectric layer 112. The second dielectric layer 150 can be a solder mask or other suitable material for protecting and electrically isolating the conductive lines 144. After forming the second dielectric layer 150, portions of the layer 150 are removed to expose sections of the conductive lines 144 and a plurality of contacts 146 can be formed on exposed sections of corresponding conductive lines 144. The contacts 146 may be constructed by electroplating or other suitable processes.

Figure 1E:
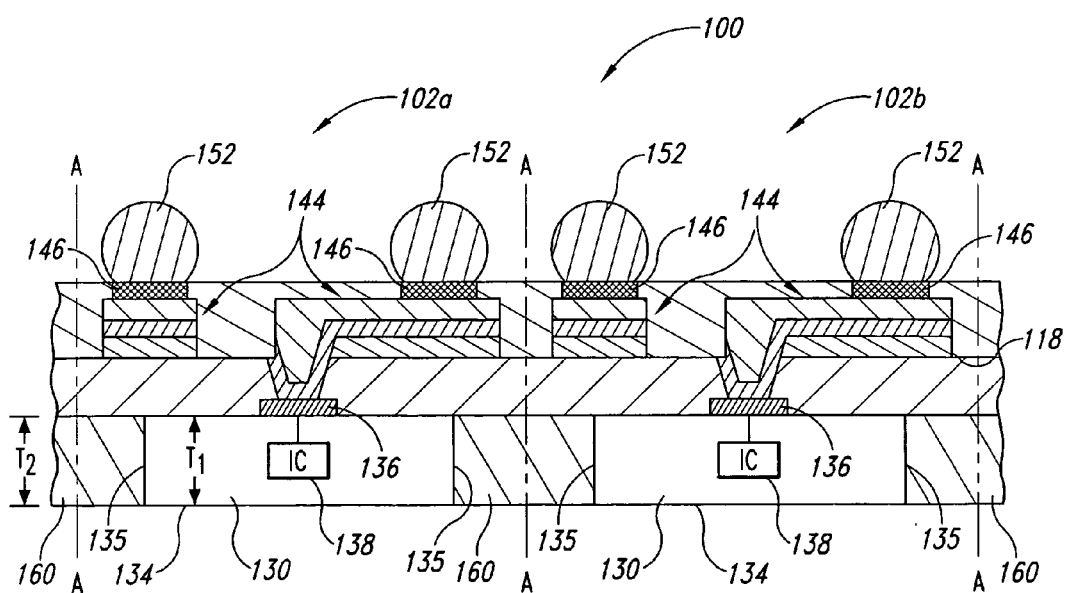

FIG. 1E is a schematic side cross-sectional view of the microelectronic device assembly 100 after encasing a portion of the dies 130. After forming the contacts 146, an encapsulant 160 is deposited onto the second surface 118 of the substrate 110 between adjacent dies 130. In the illustrated embodiment, the dies 130 have a first thickness $T_1$, and the encapsulant 160 has a second thickness $T_2$ at least approximately equal to the first thickness $T_1$. As a result, the illustrated encapsulant 160 encases the ends 135 of the dies 130. In other embodiments, the second thickness $T_2$ of the encapsulant 160 can be less than or greater than the first thickness $T_1$ of the dies 130. For example, the encapsulant may also encase the back sides 134 of the dies 130.

After encasing at least a portion of the individual dies 130, a plurality of electrical couplers 152 (e.g., solder balls) are formed on corresponding contacts 146. The electrical couplers 152 are electrically connected to corresponding terminals 136 on the dies 130, and thus the electrical couplers 152, the contacts 146, and the conductive lines 144 form a redistribution structure on the dies 130. In other embodiments, the microelectronic device assembly 100 may not include the electrical couplers 152, but rather wire-bonds can be attached to the contacts 146. In either case, the microelectronic device assembly 100 is cut along lines A-A to singulate a plurality of individual microelectronic devices 102 (identified individually as 102a-b).

One feature of the embodiment of the method illustrated above with reference to FIGS. 1A-1E is that the through holes 120 are formed in the substrate 110 before the dies 130 are attached to the substrate 110. This feature has several advantages. First, the laser drilling, punching, or other process for forming the holes 120 in the substrate 110 does not damage the terminals 136 or other components on the active sides 132 of the dies 130 because the substrate 110 is detached from the dies 130 when the holes 120 are formed. As a result, the illustrated method is expected to increase the yield of the microelectronic devices 102. Second, the microelectronic device assembly 100 does not require desmearing to remove residue and other debris from the terminals 136 on the dies 130 after forming the holes 120. Accordingly, the illustrated method reduces the number of processes required to construct the microelectronic devices 102 and increases the throughput. Third, the preformed holes 120 in the substrate 110 facilitate proper alignment of the dies 130 on the substrate 110 because the terminals 136 are visible through the holes 120. Thus, the illustrated method may not require expensive alignment tools to ensure that the holes 120 are properly aligned with the terminals 136.

Another feature of the embodiment of the method illustrated above with reference to FIGS. 1A-1E is that the dies 130 can be known good dies. An advantage of this feature is that defective dies can be excluded from the microelectronic device assembly 100. This increases the yield of the microelectronic devices 102 and reduces the number of devices 102 that malfunction and/or include defects.

C. Additional Embodiments of Methods for Manufacturing Microelectronic Devices

Figure 2A:
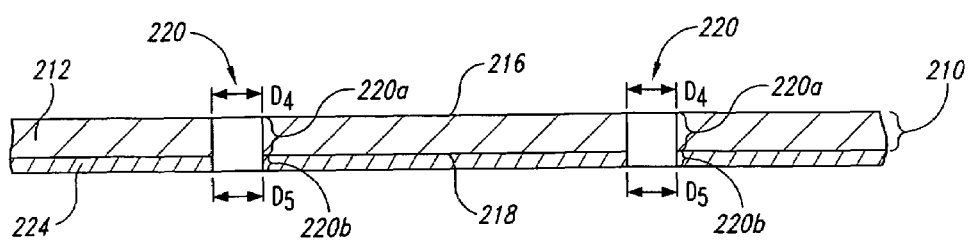
FIGS. 2A and 2B illustrate stages in another embodiment of a method for manufacturing microelectronic devices.
Figure 2B:
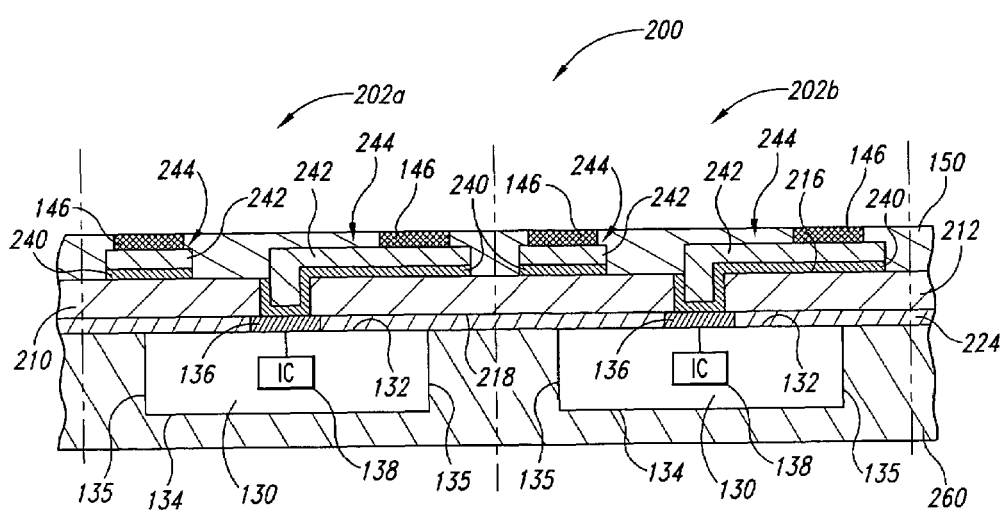

FIGS. 2A and 2B illustrate stages in another embodiment of a method for manufacturing microelectronic devices. For example, FIG. 2A is a schematic side cross-sectional view of a substrate 210 and an adhesive layer 224 on the substrate 210. The illustrated substrate 210 is generally similar to the substrate 110 described above with reference to FIG. 1A. For example, the substrate 210 includes a first dielectric layer 212, a first surface 216, a second surface 218 opposite the first surface 216, and a plurality of first holes 220a extending between the first and second surfaces 216 and 218. In the illustrated embodiment, however, the substrate 210 does not include a conductive layer, and the first dielectric layer 212 includes a fully cured material. Suitable substrates include Upilex®-based materials manufactured by UBE Industries, Ltd. of Tokyo, Japan; Kapton or Microlux, both commercially available from E.I. du Pont de Nemours and Co. of Delaware, USA; and ESPANEX, commercially available from Nippon Steel Chemical Co., Ltd. of Tokyo, Japan; and other dielectric materials.

The adhesive layer 224 is positioned on the second surface 218 of the substrate 210 for attaching the substrate 210 to a plurality of singulated dies. The adhesive layer 224 can be deposited onto the substrate 210 before or after constructing the first holes 220a in the substrate 210. In either case, the adhesive layer 224 includes a plurality of second holes 220b aligned with corresponding first holes 220a in the substrate 210. The first and second holes 220a and 220b form through holes 220 with a first dimension $D_4$ at the first surface 216 of the dielectric layer 212 and a second dimension $D_5$ at the adhesive layer 224. In the illustrated embodiment, the first dimension $D_4$ is approximately equal to the second dimension $D_5$; however, in other embodiments, the first and second dimensions $D_4$ and $D_5$ can be different. In additional embodiments, the substrate 210 may further include a conductive layer on the dielectric layer 212.

FIG. 2B is a schematic side cross-sectional view of a microelectronic device assembly 200 in accordance with another embodiment of the invention. The microelectronic device assembly 200 is generally similar to the microelectronic device assembly 100 described above with reference to FIGS. 1B-1E. For example, the illustrated assembly 200 includes the substrate 210, a plurality of singulated dies 130 carried by the substrate 210, and a redistribution structure formed at the substrate 210. In the illustrated assembly 200, however, the active sides 132 of the dies 130 are attached to the substrate 210 via the adhesive layer 224. Moreover, the illustrated redistribution structure includes a plurality of conductive traces 244 electrically coupled to corresponding terminals 136 and a plurality of contacts 146 formed on corresponding conductive traces 244. The individual conductive traces 244 include a first conductive layer 240 disposed in the holes 220 (FIG. 2A) and on the first surface 216 of the substrate 210 and a second conductive layer 242 formed on the first conductive layer 240. The illustrated contacts 146 can be configured to receive electrical couplers (e.g., solder balls) or the ends of individual wire-bonds. The illustrated microelectronic device assembly 200 further includes an encapsulant 260 encasing the ends 135 and the back side 134 of the individual dies 130. In other embodiments, the encapsulant 260 may not cover the back sides 134 and/or the entire ends 135 of the dies. After construction, the microelectronic device assembly 200 can be cut to singulate a plurality of individual microelectronic devices 202 (identified individually as 202a-b).

Figure 3A:
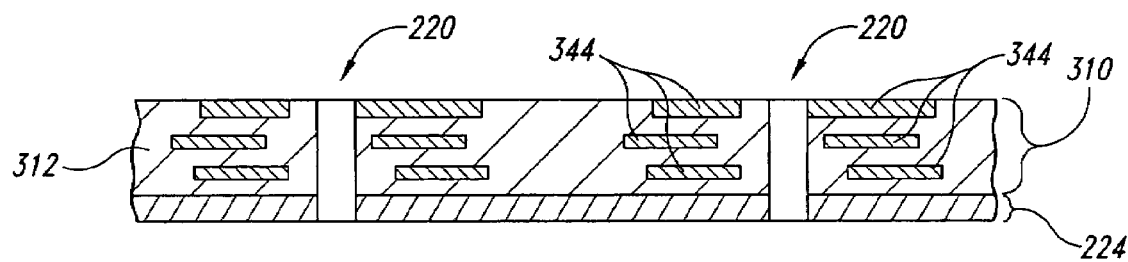
FIGS. 3A and 3B illustrate stages in another embodiment of a method for manufacturing microelectronic devices.
Figure 3B:
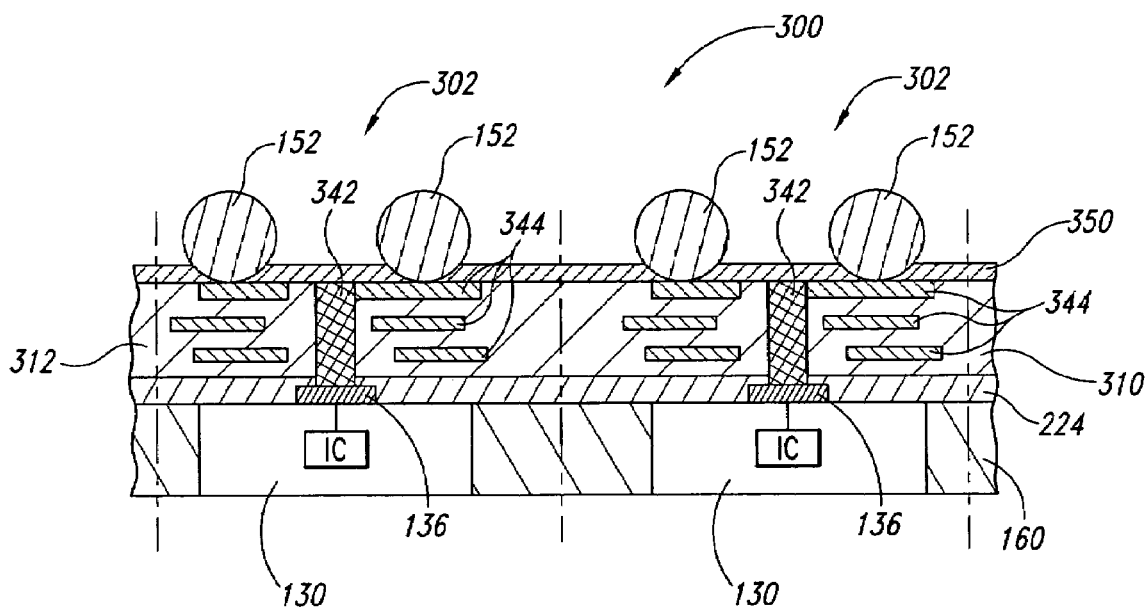

FIGS. 3A and 3B illustrate stages in another embodiment of a method for manufacturing microelectronic devices. For example, FIG. 3A is a schematic side cross-sectional view of a substrate 310 and an adhesive layer 224 on the substrate 310. The illustrated substrate 310 is a preformed multi-layer substrate and includes a dielectric material 312 and a plurality of conductive traces 344 electrically isolated from each other. The substrate 310 and the adhesive layer 224 further include a plurality of through holes 220 positioned such that each hole 220 exposes a corresponding conductive trace 344. In several embodiments, the adhesive layer 224 may be a pre-preg material.

FIG. 3B is a schematic side cross-sectional view of a microelectronic device assembly 300 in accordance with another embodiment of the invention. The illustrated assembly 300 is generally similar to the assembly 200 described above with reference to FIG. 2B. For example, the assembly 300 includes the substrate 310, a plurality of singulated dies 130 carried by the substrate 310, and a redistribution structure formed at the substrate 310. The illustrated redistribution structure includes a plurality of conductive links 342 formed in corresponding holes 220 (FIG. 3A) and electrically coupled to the associated conductive traces 344. As such, the individual conductive traces 344 are electrically connected with corresponding terminals 136 on the dies 130. The illustrated assembly 300 further includes a plurality of electrical couplers 152 formed on corresponding conductive traces 344 and a dielectric layer 350 (e.g., solder mask) formed on the substrate 310. In other embodiments, the assembly 300 may not include the electrical couplers 152, but rather wire-bonds may electrically couple the conductive traces 344 to corresponding external contacts.

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

I claim:

1. A method for manufacturing a plurality of microelectronic devices, the method comprising:
   providing a substrate having a dielectric layer, a first conductive layer on a first side of the substrate, and a plurality of through holes arranged in arrays;
   attaching a plurality of microelectronic dies to the substrate with an active side of the individual dies facing toward the substrate and with a plurality of terminals on the active side of the individual dies aligned with corresponding through holes in the substrate, wherein the dies are attached to the substrate after forming the through holes in the substrate;
   placing conductive material in the through holes to form a second conductive layer on the first conductive layer after attaching the dies to the substrate, wherein the second conductive layer forms a redistribution structure;
   placing a third conductive layer on the second conductive layer to form a redistribution layer; and removing sections of the redistribution layer, the first conductive layer, and the second conductive layer to form conductive lines on the substrate.

2. The method of claim 1 wherein the individual dies further comprise a back side opposite the active side and a plurality of ends extending between the active side and the back side, and wherein the method further comprises:
curing the substrate after attaching the dies to the substrate; and
placing an encapsulant between adjacent dies to encase at least a portion of the ends of the dies.

3. The method of claim 1 wherein providing the substrate comprises forming the through holes in a partially cured substrate.

4. The method of claim 1 wherein providing the substrate comprises forming the through holes in a pre-preg material.

5. The method of claim 1 wherein
providing the substrate comprises removing a plurality of first sections of the conductive layer with a first process and removing a plurality of second sections of the dielectric layer with a second process different than the first process.

6. The method of claim 1 wherein
providing the substrate comprises removing a plurality of first sections of the conductive layer with an etching process and removing a plurality of second sections of the dielectric layer with a different process.

7. The method of claim 1 wherein attaching the microelectronic dies to the substrate comprises coupling singulated dies to the substrate without an adhesive positioned between the substrate and the dies.

8. The method of claim 1, further comprising curing the substrate after attaching the dies to the substrate.

9. The method of claim 1 wherein providing the substrate comprises laser drilling the through holes in the substrate.

10. The method of claim 1 wherein providing the substrate comprises punching the substrate to construct the through holes.

11. The method of claim 1 wherein the individual dies further comprise a back side opposite the active side and a plurality of ends extending between the active side and the back side, and wherein the method further comprises:
constructing a redistribution structure at the substrate, the redistribution structure including a plurality of conductive lines electrically connected to corresponding terminals on the dies; and
placing an encapsulant between adjacent dies to encase at least a portion of the ends of the dies.

12. The method of claim 1, further comprising:
placing an adhesive layer on the substrate; and
forming a plurality of holes in the adhesive layer such that the holes in the adhesive layer are aligned with corresponding holes in the substrate.

13. The method of claim 1 wherein providing the substrate comprises constructing the through holes in the substrate such that the individual holes have a dimension less than a dimension of the individual terminals.

14. A method for manufacturing a plurality of microelectronic devices, the method comprising:
providing a plurality of singulated microelectronic dies and a substrate, the substrate comprising a dielectric layer and a first conductive layer, the substrate having a plurality of holes arranged in arrays, the individual dies including an active side and a plurality of terminals at the active side;
coupling the active sides of the singulated dies to the substrate such that the terminals are aligned with corresponding holes;
forming a redistribution structure on the first conductive layer after coupling the dies to the substrate, the redistribution structure including a plurality of contacts electrically coupled to the first conductive layer and to corresponding terminals on the dies placing a third conductive layer on the second conductive layer to form a redistribution layer; and removing sections of the redistribution layer, the first conductive layer, and the second conductive layer to form conductive lines on the substrate.

15. The method of claim 14 wherein forming the redistribution structure comprises depositing a conductive layer in the holes.

16. The method of claim 14 wherein:
the substrate further comprises a first surface facing the dies and a second surface opposite the first surface; and
forming the redistribution structure comprises placing a second conductive layer in the holes and onto at least a portion of the second surface of the substrate.

17. The method of claim 14 wherein providing the substrate with the holes comprises forming the holes in the substrate before coupling the dies to the substrate.

18. The method of claim 14 wherein coupling the dies to the substrate comprises attaching the dies to a partially cured substrate.

19. The method of claim 14 wherein:
the individual dies further comprise a back side opposite the active side and a plurality of ends extending between the active side and the back side; and
coupling the dies to the substrate comprises attaching the dies to the substrate such that adjacent dies are spaced apart by a gap and at least a portion of the ends of the individual dies are exposed.

20. A method for manufacturing a plurality of microelectronic devices, the method comprising:
attaching a plurality of singulated microelectronic dies to a partially cured substrate, the substrate has a first side with a first conductive layer, a second side, and a plurality of through apertures, wherein the plurality of singulated microelectronic dies are attached to the second side with an active side of the individual dies facing toward the substrate, and the individual dies include a plurality of terminals each aligned with a corresponding through apertures;
curing the substrate after attaching the singulated dies;
constructing a redistribution structure at the first side of the substrate, the redistribution structure including a plurality of conductive lines electrically coupled to the first conductive layer and to corresponding terminals on the dies placing a third conductive layer on the second conductive layer to form a redistribution layer; and removing sections of the redistribution layer, the first conductive layer, and the second conductive layer to form conductive lines on the substrate.

21. The method of claim 20 wherein attaching the dies to the substrate comprises coupling the dies to a substrate having preformed apertures.

22. The method of claim 20 wherein attaching the dies to the substrate comprises coupling the dies to a pre-preg material.

23. The method of claim 20 wherein attaching the singulated dies to the partially cured substrate comprises coupling the dies to the substrate without an adhesive positioned between the dies and the substrate.

24. The method of claim 20 wherein constructing the redistribution structure comprises depositing a conductive material into the apertures.

25. A method for manufacturing a microelectronic device, the method comprising:
providing a substrate having a dielectric layer and a first conductive layer;

forming a plurality of through holes in the substrate with the holes arranged in arrays corresponding to at least one array of terminals on a microelectronic component;

forming a second conductive layer in electrical connection with the first conductive layer and with at least one terminal on at least one microelectronic component attached to the substrate wherein the second conductive layer forms a redistribution structure;

placing a third conductive layer on the second conductive layer to form a redistribution layer; and removing sections of the redistribution layer, the first conductive layer, and the second conductive layer to form conductive lines on the substrate.

26. The method of claim 25 wherein forming the holes in the substrate comprises constructing the holes in a partially cured substrate.

27. The method of claim 25 wherein forming the holes in the substrate comprises constructing the holes in a pre-preg material.

28. The method of claim 25 wherein forming the holes in the substrate comprises at least one of laser drilling or punching the substrate.

29. A method for manufacturing a plurality of microelectronic devices, the method comprising:

providing a plurality of dies each having an active side and a plurality of terminals arranged in a terminal array at the active side;

providing a preformed substrate separate from the dies, wherein the preformed substrate has a dielectric layer, a first conductive layer, and a plurality of through hole arrays, wherein individual through hole arrays have a plurality of individual through holes arranged to correspond to the terminals of a terminal array;

attaching the microelectronic dies to the substrate with the active side of individual dies facing toward the substrate and with individual terminals of individual dies aligned with corresponding individual through holes in the substrate, wherein the dies are attached to the substrate after forming the through holes in the substrate;

placing conductive material in the through holes to form a second conductive layer on the first conductive layer after attaching the dies to the substrate, wherein the second conductive layer forms a redistribution structure;

placing a third conductive layer on the second conductive layer to form a redistribution layer; and removing sections of the redistribution layer, the first conductive layer, and the second conductive layer to form conductive lines on the substrate.

* * * * *

UNITED STATES PATENT AND TRADEMARK OFFICE
CERTIFICATE OF CORRECTION

PATENT NO. : 7,553,699 B2  
APPLICATION NO. : 11/515090  
DATED : June 30, 2009  
INVENTOR(S) : Teck Kheng Lee Page 1 of 1

It is certified that error appears in the above-identified patent and that said Letters Patent is hereby corrected as shown below:

On the Title Pg, Item (56), under "Other Publications", line 2, delete "20060527-6." and insert -- 200605271-6. --, therefor.

In column 10, line 1, in Claim 14, after "dies" insert -- ; --.

In column 10, line 40, in Claim 20, delete "apertures;" and insert -- aperture; --, therefor.

In column 10, line 42, in Claim 20, delete "at" and insert -- on --, therefor.

In column 10, line 46, in Claim 20, delete "dies" and insert -- dies; --, therefor.

In column 11, line 7, in Claim 25, delete "substrate" and insert -- substrate, --, therefor.

Signed and Sealed this

Eighteenth Day of August, 2009

David J. Kappos  
*Director of the United States Patent and Trademark Office*